United States Patent [19]

Ienaka et al.

[11] 4,313,145

[45] Jan. 26, 1982

[54] POWER OUTPUT CIRCUIT

[75] Inventors: Masanori Ienaka; Masahiro Yamamura, both of Kodaira; Kazuo Watanabe; Yasuo Kominami, both of Kokubunji, all of Japan

[73] Assignee: Hitachi, Ltd., Tokyo, Japan

[21] Appl. No.: 83,657

[22] Filed: Oct. 11, 1979

[30] Foreign Application Priority Data

Oct. 20, 1978 [JP] Japan .............................. 53-128368

[51] Int. Cl.[3] .............................................. H02H 7/20

[52] U.S. Cl. ......................................... 361/79; 361/98; 361/88; 330/207 P

[58] Field of Search ....................... 361/88, 79, 93, 98, 361/91; 330/207 P, 298

[56] References Cited

U.S. PATENT DOCUMENTS

| | | | |
|---|---|---|---|
| 3,691,427 | 9/1972 | Honda et al. | 330/207 P X |
| 3,835,412 | 9/1974 | Honda et al. | 330/298 |
| 3,992,678 | 11/1976 | Suzuki | 330/298 X |
| 4,034,268 | 7/1977 | Klauck | 330/207 P X |
| 4,150,339 | 4/1979 | Sueyoshi et al. | 330/298 |
| 4,216,517 | 8/1980 | Takahashi | 330/207 P X |

*Primary Examiner*—Patrick R. Salce
*Attorney, Agent, or Firm*—Craig and Antonelli

[57] ABSTRACT

An output from an OCL type power output circuit is applied to a loudspeaker load through a switching means such as a relay. A first detector circuit and a second detector circuit detect a first operating status (e.g., output d.c. level) and a second operating status (e.g., output current level of an output transistor) of the OCL type power output circuit, respectively. The detection output signals of the first detector circuit and the second detector circuit are respectively applied to a first detecting transistor and a second detecting transistor. In the normal operation status of the OCL type power output circuit, the first detecting transistor and the second detecting transistor are respectively biased into "on" states by the first detector circuit and the second detector circuit so as to permit predetermined currents to flow. When the first and second detecting transistors are in their "on" states they control a driving transistor into an "on" state. Then, the switching means, such as a relay, is controlled into a closed state. In the abnormal operation status of the OCL type power output circuit, the first detector circuit or the second detector circuit controls the first detecting transistor or the second detecting transistor into an "off" state, so that the switching means, such as a relay, is controlled into an open state.

2 Claims, 5 Drawing Figures

+V
-V
Tin
IC
SW
RL
SP
Vcd
Vref1
Vref2
Vref3
Vs
Vo

POWER OUTPUT CIRCUIT

BACKGROUND OF THE INVENTION

This invention relates to a power output circuit.

A prior-art protective circuit for a power output circuit known from, for example, Japanese patent application laid open specification No. 48-3064 protects the load (loudspeaker) of the power output circuit of the OCL (Output Condenser Less) type.

In order to prevent the loudspeaker from being damaged by a deviation in the output d.c. level (mid-point potential) of the OCL type power output circuit, the known protective circuit detects that the output d.c. level has exceeded a predetermined voltage, and using the detection output it turns "off" switching means such as a relay disposed between the output of the power output circuit and the loudspeaker. Thus, the voice coil of the loudspeaker can be protected from burning attributed to the passage of direct current.

On the other hand, the inventors' study has revealed that, in case of constructing this sort of protective circuit into a semiconductor integrated circuit, detecting transistors for effecting the above detection are destroyed by any abnormal operation of the power output circuit or various surge voltages applied to the semiconductor integrated circuit.

When the detecting transistors have been destroyed, there is the danger that the turning-off of the switching means such as relay disposed between the output of the electric circuit such as OCL type power output circuit and the loudspeaker load will not be effected, resulting in the burning of the loudspeaker load.

The inventors' study has also revealed the following. For protecting the load such as loudspeaker from the abnormal output of the electric circuit such as OCL type power output circuit, it is favorable from the standpoint of enhancing the reliability of the protective operation that, not only the output d.c. level as stated above, but also the abnormal current increase of output transistors attributed to thermal runaway, short-circuit of the load, or the like is detected and that the switching means is turned "off" on the basis of either of these detection outputs. Detecting transistors for detecting the current of the output transistors are destroyed in the same manner as described above.

SUMMARY OF THE INVENTION

An object of this invention is to provide a protective circuit for a power output circuit in which the reliabilities of protective operations are enhanced.

DESCRIPTION OF THE PREFERRED EMBODIMENTS

Hereunder, this invention will be concretely described in connection with embodiments.

Figure 1:
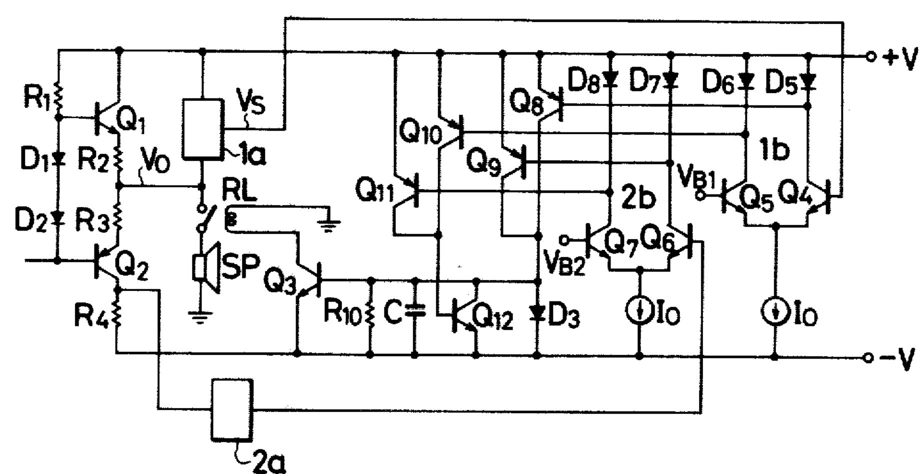
FIG. 1 is a circuit diagram showing an embodiment of this invention.

FIG. 1 is a circuit diagram showing an embodiment wherein this invention is applied to a complementary push-pull output circuit with two supply voltages. The embodiment detects a fluctuation in an output mid-point potential and an output overcurrent so as to protect a load and output transistors.

An n-p-n transistor $Q_1$ and a p-n-p transistor $Q_2$ constitute a complementary push-pull output circuit of the OCL (output condenser less) type. This push-pull power output circuit operates with a positive supply voltage $+V$ and a negative supply voltage $-V$ as its operating voltages.

A resistor $R_1$ is a load of a driver circuit (not shown), and diodes $D_1$, $D_2$ constitute a bias circuit for the transistors Q, $Q_2$.

A level shift circuit 1*a* constitutes part of an output d.c. level-detector circuit, and converts 0 (zero) V being the output mid-point potential $V_o$ into a positive voltage $V_S$. This level shift output $V_s$ is applied to the base of a detecting transistor $Q_4$ in a differential transistor circuit 1*b* which constitutes another part of the output d.c. level-detector circuit. On the other hand, the base of a reference transistor $Q_5$ has a bias voltage $V_{B1}$ set so that, at a normal output, the reference transistor $Q_5$ may turn "off" whereas the detecting transistor $Q_4$ may turn "on".

In case of detecting the deviation of the mid-point potential in the negative direction, a circuit which is similar to that described above and in which the input and bias voltage of transistors are inverted is employed (not shown).

A circuit block 2*a* constitutes part of a detector circuit for detecting an overcurrent of the output transistor $Q_2$. It forms a signal becoming a high level in the normalcy, and applies the signal to the base of a detecting transistor $Q_6$ in a differential transistor circuit 2*b*. On the other hand, the base of a reference transistor $Q_7$ has a bias voltage $V_{B2}$ set so that, at the normal output, the reference transistor $Q_7$ may turn "off" whereas the detecting transistor $Q_6$ may turn "on".

The common emitters of the differential transistor circuits $Q_4$, $Q_5$ and $Q_6$, $Q_7$ are respectively provided with constant-current circuits $I_o$.

The collectors of the respective differential transistors $Q_4$–$Q_7$ are provided with diodes $D_5$–$D_8$ which constitute current mirror circuits. The collectors of corresponding transistors $Q_8$, $Q_9$ of p-n-p type controlling transistors $Q_8$–$Q_{11}$ which constitute output transistors of the current mirror circuits are made common so as to cause collector currents to flow into a diode $D_3$. The forward voltage of this diode $D_3$ is applied across the base and emitter of a driving transistor $Q_3$ through a capacitor C and a resistor $R_{10}$ which constitute a smoothing circuit.

The relay RL is energized by the "on" current of the transistor $Q_3$, to close a contact which is disposed between a push-pull output terminal and a load SP.

On the other hand, the collectors of corresponding transistors $Q_{10}$, $Q_{11}$ of the p-n-p transistors $Q_8$–$Q_{11}$ which constitute the output transistors of the current mirror circuits are made common so as to cause common collector currents to flow into the base of a transistor $Q_{12}$ which short-circuits the base-emitter path of the driving transistor $Q_3$.

In the circuit of the above embodiment, under the state under which the push-pull output circuit is in the normal operation, the detecting transistors $Q_4$, $Q_6$ turn "on", and the constant current $2 \cdot I_o$ flows into the diode $D_3$, to turn the driving transistor $Q_3$ "on" and to connect the output terminal and the load SP.

When either of the two detected outputs is in an abnormal state, the constant current $I_o$ flows into the base of the protective transistor $Q_{12}$, so that a greet current of $I_o \times h_{FEQ12}$ (current gain) is absorbed as the output collector current. The driving transistor $Q_3$ consequently turns "off" because no base current flows therethrough, and it opens the contact SW of the relay RL to protect the loudspeaker (load) or the output transistors.

Considering the fact that the defective disconnection mode accounts for the great majority of the defective modes of detecting transistors, this invention sets the correlations between detection signals and transistors so as to turn "on" all the detecting transistors which receive the detection signals in a normal operation state.

In the circuit of this embodiment, accordingly, when the detecting transistors $Q_4$, $Q_6$ are defective in the disconnection mode, the constant currents flow through the transistors $Q_5$, $Q_7$. Therefore, the relay RL is turned "off" to break the connection with the load and to inhibit the drive of the load by the output circuit under the defenseless state. An enhancement in reliability can accordingly be achieved.

In this embodiment, the level shift circuit 1 is not especially required. This is because the transistor $Q_4$ can be turned "on" in the normalcy by properly selecting the bias voltage $V_{B1}$.

Figure 2:
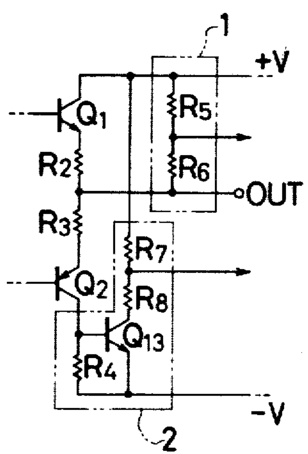
FIGS. 2 and 3 are circuit diagrams each showing a detector circuit.

In case where the level shift is required, the voltage of 0 V at the mid-point is subjected to the level shift in the positive direction by means of resistors $R_5$, $R_6$ as illustrated in FIG. 2. The output overcurrent detector circuit 2 can employ the collector resistors $R_7$, $R_8$ of a phase inverting transistor $Q_{13}$.

Figure 3:
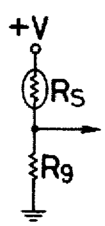

As a temperature detector circuit, a voltage divider circuit which is made up of a temperature sensor $R_s$ of positive temperature characteristic and a resistor $R_9$ as shown in FIG. 3 may be used, the divided voltage output being applied to a differential circuit similar to that described above.

Further, a circuit for detecting the short-circuit-condition of the load may well be disposed, a similar output being applied to a differential circuit similar to that described above.

Figure 4:
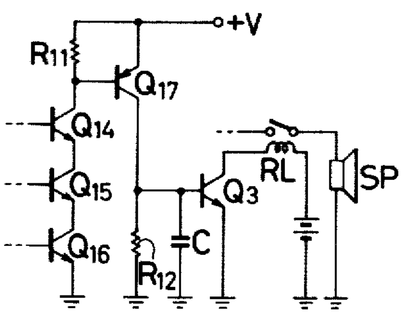
FIG. 4 is a circuit diagram showing another embodiment of this invention.

The detecting transistor circuit may well be such that, as shown in FIG. 4, detecting transistors $Q_{14}$–$Q_{16}$ are merely connected in series, the collector output of the series transistors being received by a p-n-p type controlling transistor $Q_{17}$, the collector output of which is used to control the relay driving transistor $Q_3$ described above.

In this case, only when all the detecting transistors $Q_{14}$–$Q_{16}$ turn "on", the transistor $Q_{17}$ can turn "on" to turn the relay driving transistor $Q_3$ "on", so that the same protective operation as previously described is effected.

This invention can be extensively utilized, not only for the push-pull output circuit with two supply voltages, but also for power output circuits such as a push-pull circuit with a single supply voltage. In this case, detection signals may be formed as are necessary.

Figure 5:
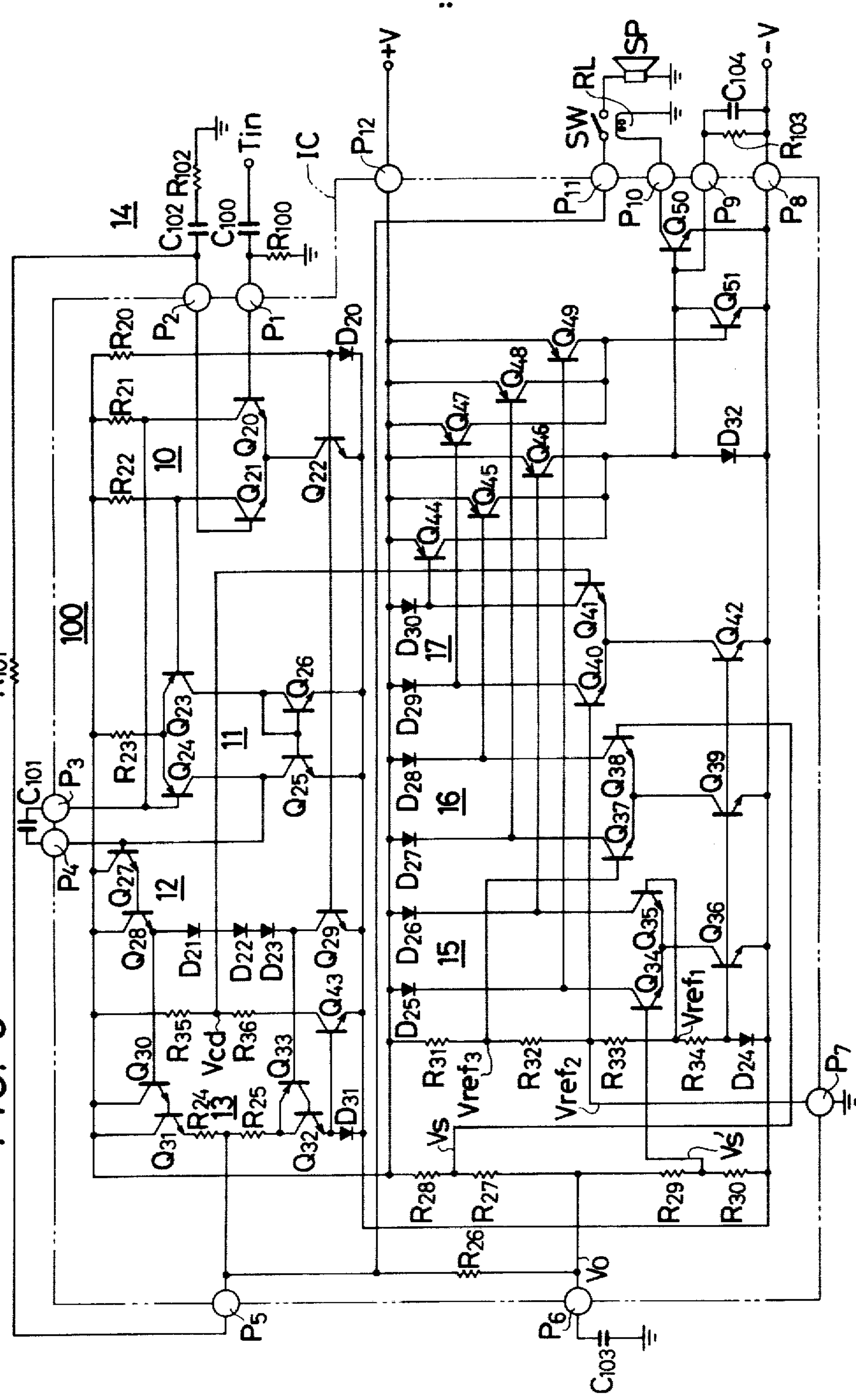
FIG. 5 is a circuit diagram showing a concrete embodiment of this invention.

An electric circuit 100 shown in FIG. 5 includes an OCL type power output circuit, in which circuit elements enclosed with a broken line IC are constructed within a semiconductor integrated circuit and the other circuit elements are constructed of discrete electronic components. The power output circuit in the electric circuit 100 operates using as its operating voltages a positive supply voltage $+V$ applied to a terminal $P_{12}$ and a negative supply voltage $-V$ applied to a terminal $P_8$.

An input signal applied to an input terminal $T_{in}$ is transmitted to a first-stage differential amplifier circuit 10 through an input capacitor $C_{100}$. A terminal $P_1$ has the ground potential applied thereto as a d.c. bias voltage by means of a resistor $R_{100}$. The first-stage differential amplifier circuit 10 is made up of differential pair N-P-N transistors $Q_{20}$, $Q_{21}$, a transistor $Q_{22}$ functioning as a constant-current source, and load resistors $R_{21}$, $R_{22}$.

Two differential output signals from the first-stage differential amplifier circuit 10 are applied to a differential amplifier circuit for drive 11. The driving differential amplifier circuit 11 is made up of differential pair P-N-P transistors $Q_{23}$, $Q_{24}$, an emitter resistor $R_{23}$, N-P-N transistors $Q_{25}$, $Q_{26}$ constituting constant-current loads, and a phase compensating capacitor $C_{101}$.

An output signal from the driving differential amplifier circuit 11 is transmitted to an emitter follower circuit 12. The emitter follower circuit 12 is made up of Darlington-connected transistors $Q_{27}$, $Q_{28}$, diodes $D_{21}$–$D_{23}$ for adjusting an idling current, and a transistor $Q_{29}$ functioning as a constant-current circuit.

Two output signals obtained from the emitter follower circuit 12 are applied to an OCL type power output circuit 13. The OCL type power output circuit 13 is constructed of a quasi-complementary push-pull circuit which includes N-P-N transistors $Q_{30}$–$Q_{32}$, a P-N-P transistor $Q_{33}$, and emitter resistors $R_{24}$, $R_{25}$.

The output signal of the OCL type power output circuit 13 provided from a terminal $P_{11}$ is transmitted to a loudspeaker SP through a switch SW of a relay RL. On the other hand, the output signal of the OCL type power output circuit 13 provided from a terminal $P_5$ is applied to a terminal $P_2$ through a d.c.-a.c. negative feedback circuit 14 which is composed of resistors $R_{101}$, $R_{102}$ and a capacitor $C_{102}$.

Under the negative feedback action of the d.c.-a.c. negative feedback circuit 14, accordingly, the output d.c. level at the output terminals $P_5$ and $P_{11}$ during the normalcy of the OCL type power output circuit follows up the d.c. bias voltage (ground potential) applied to the terminal $P_1$. At any abnormal operation of the OCL type power output circuit, however, the output d.c. level at the output terminals $P_5$ and $P_{11}$ deviates to a positive or negative voltage.

A resistor $R_{26}$ and a capacitor $C_{103}$ which are connected to a terminal $P_6$ smooth the output signal of the OCL type power output circuit so as to produce an output d.c. level $V_o$. Resistors $R_{27}$ and $R_{28}$ generate a d.c. level $V_s$ subjected to a positive level shift, while resistors $R_{29}$ and $R_{30}$ generate a d.c. level $V_s'$ subjected to a negative level shift.

Resistors $R_{31}$, $R_{32}$, $R_{33}$, $R_{34}$ and a diode $D_{24}$ are connected in series between the terminal $P_{12}$ and the terminal $P_8$, whereby reference voltages $V_{ref1}$, $V_{ref2}$, $V_{ref3}$ are generated. The common juncture of the resistors $R_{32}$ and $R_{33}$ is connected with the ground potential through a terminal $P_7$, whereby the reference potential $V_{ref2}$ is made equal to the ground potential.

A differential amplifier circuit 15 is made up of a detecting transistor $Q_{34}$, a reference transistor $Q_{35}$, a transistor $Q_{36}$ functioning as a constant-current source, and diodes $D_{25}$, $D_{26}$. The relation of $V_{ref1} > V_s'$ is set so that, during the normal operation of the OCL type power output circuit, the detecting transistor $Q_{34}$ may turn "off" whereas the reference transistor $Q_{35}$ may turn "on".

A differential amplifier circuit 16 is made up of a reference transistor $Q_{37}$, a detecting transistor $Q_{38}$, a transistor $Q_{39}$ functioning as a constant-current source, and diodes $D_{27}$, $D_{28}$. The relation of $V_{ref3} < V_s$ is set so that, during the normal operation of the OCL type power output circuit, the reference transistor $Q_{37}$ may turn "off" whereas the detecting transistor $Q_{38}$ may turn "on".

A differential amplifier circuit 17 is made up of a reference transistor $Q_{40}$, a detecting transistor $Q_{41}$, a transistor $Q_{42}$ functioning as a constant-current source, and diodes $D_{29}$, $D_{30}$. The emitter current of the output transistor $Q_{32}$ of the OCL type power output circuit 13 is detected by a current mirror circuit which is composed of a diode $D_{31}$ and a transistor $Q_{43}$. Letting $V_{cd}$ denote a detection voltage at the node between resistors $R_{35}$ and $R_{36}$, the resistance value of the resistor $R_{35}$ is set so that $V_{cd} > V_{ref2}$ may be met during the normal operation of the OCL type power output circuit 13 and that the reference transistor $Q_{40}$ may turn "off" whereas the detecting transistor $Q_{41}$ may turn "on" during the same.

The transistors $Q_{36}$, $Q_{39}$, $Q_{42}$ functioning as the constant-current sources are biased by the diode $D_{24}$. Thus, constant currents $I_o$ flow through these transistors.

During the normal operation of the OCL type power output circuit 13, accordingly, the constant currents $I_o$ flow through respective controlling transistors $Q_{44}$, $Q_{45}$, $Q_{46}$ because the transistors $Q_{35}$, $Q_{38}$, $Q_{41}$ are "on" in the differential amplifier circuits 15, 16, 17. Therefore, a constant current $3 \cdot I_o$ flows through a diode $D_{32}$ connected to the collectors of the controlling transistors, with the result that a driving transistor $Q_{50}$ turns "on". Thus, the relay RL is energized, the contact SW is closed, and the output signal of the OCL type power output circuit 13 at the terminal $P_{11}$ is transmitted to the loudspeaker SP.

On the other hand, when the output d.c. level $V_o$ of the OCL type power output circuit 13 has changed into a negative level on account of the abnormal operation thereof, the relation of $V_{ref3} > V_s$ holds. As a result, the reference transistor $Q_{37}$ turns "on" whereas the detecting transistor $Q_{38}$ turns "off". Then, the constant current $I_o$ flows through a controlling transistor $Q_{48}$, and a great current expressed by $I_o \times h_{FEQ51}$ flows through the collector of a transistor $Q_{51}$. Thus, the driving transistor $Q_{50}$ is turned "off", and the output signal of the OCL type power output circuit 13 is not transmitted to the loudspeaker SP.

On the contrary, when the output d.c. level $V_o$ of the OCL type power output circuit 13 has changed into a positive level on account of the abnormal operation thereof, the relation of $V_{ref1} < V_s'$ holds. As a result, the detecting transistor $Q_{34}$ turns "on" whereas the reference transistor $Q_{35}$ turns "off". Then, the constant current $I_o$ flow through a controlling transistor $Q_{49}$, and the great current $I_o \times h_{FEQ51}$ flows through the collector of the protective transistor $Q_{51}$. Likewise to the above, the driving transistor $Q_{50}$ is turned "off", and the output signal of the OCL type power output circuit 13 is not transmitted to the loudspeaker SP.

On the other hand, when the emitter current of the output transistor $Q_{35}$ has abnormally increased on account of the abnormal operation of the OCL type power output circuit 13 such as thermal runaway of the output transistor $Q_{35}$, the relation of $V_{cd} < V_{ref}$ is met. As a result, the reference transistor $Q_{40}$ turns "on" whereas the detecting transistor $Q_{41}$ turns "off", to cause the constant current $I_o$ to flow through a controlling transistor $Q_{47}$. Accordingly, the great current $I_o \times h_{FEQ51}$ flows through the collector of the protective transistor $Q_{51}$, and the driving transistor $Q_{50}$ is turned "off".

As set forth above, in case where any one of the various abnormal operations of the OCL type power output circuit 13 has occurred, the driving transistor $Q_{50}$ is turned "off" to disconnect the loudspeaker SP from the output of the OCL type power output circuit 13, whereby the loudspeaker can be protected from the damage of its voice coil.

Furthermore, even when the transistor $Q_{38}$ or $Q_{41}$ among the detecting transistors $Q_{34}$, $Q_{38}$, $Q_{41}$, has undergone the defective disconnection mode, the reference transistor $Q_{37}$ or $Q_{40}$ turns "on" to open the contact SW of the relay RL. Thus, in case where the defective disconnection mode of the detecting transistor has occurred, the loudspeaker sp is disconnected from the output of the OCL type power output circuit 13, and hence, the enhancement of reliability can be achieved.

What is claimed is:

1. A power output circuit comprising:

load means to be driven by an output of said power output circuit;

switching means connected between said output of said power output circuit and said load means;

a first detector circuit for detecting a first operating status of said power output circuit;

a second detector circuit for detecting a second operating status of said power output circuit;

a first detecting transistor which receives an output signal of said first detector circuit;

a second detecting transistor which receives an output signal of said second detector circuit; and a driving transistor which receives an output signal of said first detecting transistor and an output signal of said second detecting transistor and which operates to drive said switching means into an "off" or "on" state;

wherein under a condition under which said first and second operating statuses of said power output circuit lie in predetermined operating ranges respectively, said first and second detecting transistors are respectively biased into "on" states by said first and second detector circuits so as to permit predetermined currents to flow therethrough, and further, said driving transistor is controlled into an "on" state by said output signals of said first and second detecting transistors so as to drive said switching means into the "on" state, said power output circuit further comprising:

a first reference transistor which is connected with said first detecting transistor in a differential manner;

a second reference transistor which is connected with said second detecting transistor in a differential manner;

a first constant-current source which is connected to an emitter of said first detecting transistor and an emitter of said first reference transistor;

a second constant-current source which is connected to an emitter of said second detecting transistor and an emitter of said second reference transistor;

a protective transistor whose collector and emitter are respectively connected to a base and an emitter of said driving transistor;

a first group of controlling transistors whose base-emitter junctions have collector signals of said first and second detecting transistors applied thereto and whose collectors are connected to said base of said driving transistor in common; and a second group of controlling transistors whose base-emitter junctions have collector signals of said first and second detecting transistors applied thereto and whose collectors are connected to a base of said protective transistor in common;

wherein when said first operating status or said second operating status of said power output circuit has fallen outside the predetermined operating range, said protective transistor is controlled into an "on" state by collector signals of said second group of controlling transistors so as to control said driving transistor into an "off" state.

2. A power output circuit according to claim 1, wherein said first detector circuit detects an output d.c. level of said power output circuit, while said second detector circuit detects a level of an output current of an output transistor in said power output circuit.

* * * * *